United States Patent [19]

Chaki

[11] Patent Number: 4,512,205
[45] Date of Patent: Apr. 23, 1985

[54] ARM MECHANISM OF A PUSHBUTTON TUNER

[75] Inventor: Takao Chaki, Tokyo, Japan

[73] Assignee: Clarion Co., Ltd., Tokyo, Japan

[21] Appl. No.: 439,852

[22] Filed: Nov. 8, 1982

[30] Foreign Application Priority Data

Nov. 11, 1981 [JP] Japan .............. 56-167112[U]

[51] Int. Cl.³ .................................... H03J 5/12
[52] U.S. Cl. .................................. 74/10.33; 334/7
[58] Field of Search ............ 74/10.33, 10.37; 334/7

[56] References Cited

U.S. PATENT DOCUMENTS 4,133,214  1/1979  Cicala ................. 74/10.33 X
4,331,038  5/1982  Naoi .................... 74/10.33

FOREIGN PATENT DOCUMENTS 55-107324  8/1980  Japan ................... 74/10.33

Primary Examiner—Allan D. Herrmann
Attorney, Agent, or Firm—Russell E. Hattis; Stephen R. Arnold

[57] ABSTRACT

A pushbutton tuner arm mechanism features a lockable setting plate rotatably mounted on an arm reciprocatingly actuated by a pushbutton, the setting plate having an extension configured to engage a V-shaped tuning notch in a memory slide. A locking spring affixed to the arm peripherally engages portions of the setting plate to hold the arm in a chosen position, the locking force being releasable upon extraction of the pushbutton. An arcuate boss integral with the setting plate is configured to engage portions of a generally V-shaped cut in the arm to provide positive play-free locking of the setting arm in position.

3 Claims, 6 Drawing Figures

ARM MECHANISM OF A PUSHBUTTON TUNER

BACKGROUND OF THE INVENTION

1. Field of the Invention

This invention relates to an arm mechanism of a pushbutton tuner.

2. Description of the Prior Art

In a pushbutton tuner a desired frequency is selected by inserting a core into a tuning coil as far as a predetermined position, which core is moved together with a memory slide, which is pushed by a setting plate so that its displacement is varied by varying appropriately the mounting angle of the setting plate disposed on an arm of the tuner.

For such a pushbutton tuner, heretofore, a structure, as shown in FIG. 1, has been adopted in order to fix the setting plate by a desired angle to the arm. That is, the setting plate 3 is mounted rotatably on a surface of the arm 1 by using an axle 2, and rotational displacements of the setting plate 3 on the arm are prevented by pressing the other end of the setting plate downwards by a plate spring 4 assisted by a spring-compressing setting pin 5. However, since the setting plate 3 is pressed downwards by the plate spring 4, the setting pin 5 used as a fulcrum for the plate spring 4 should be high, and consequently such prior art type of pushbutton tuners have the disadvantage that the thickness of the whole arm is relatively great.

Accordingly, recently, in order to fulfil the requirement of making a pushbutton tuner thinner, instead of the prior art type shown in FIG. 1, it has been proposed to use an arm mechanism in which the setting plate is fixed by nipping it at its periphery (FIGS. 2A and 2B). That is, a setting plate 13 is mounted rotatably on a surface of the arm 11 by utilizing a setting pin 12 having a flange at its upper end. At the lower surface of this setting plate 13 is formed in one united body a boss 14, whose periphery is arc shaped. The periphery of this boss 14 is surrounded by an approximately U-shaped plate spring 15, and fastened by the plate spring 15 by pressing it from both the sides by means of a pushbutton so that the setting plate 13 cannot rotate around the setting pin 12. For such an arm mechanism the thickness of the whole arm mechanism can be small indeed with respect to that shown in FIG. 1, because the setting plate 13 is pressed by the plate spring 15 horizontally from both the sides and effectively serves to make the pushbutton tuner smaller and thinner. However, when this type of pushbutton tuner is adopted in practice, it gives rise to inconvenience. That is, since the setting plate 13 should be mounted rotatably with respect to the setting pin 12, there are always some play between the setting pin 12 and the side wall of the hole formed for it in the setting plate 13. Consequently, due to this play, it may be feared that the center position of the setting plate is different for the case where the setting plate rotates freely and for the case where it is fixed by the plate spring. When the center position of the setting plate is thus not at a well determined position, it is difficult to effect an accurate positioning of the setting plate according to the frequency to be selected. This gives rise in turn to errors in frequency, and the performance of the tuner is considerably lowered.

SUMMARY OF THE INVENTION

This invention has been proposed in order to eliminate these disadvantages of such prior art arm mechanisms in the pushbutton tuners.

According to this invention, a new arm mechanism for a pushbutton tuner is proposed in which the center position of the setting plate remains always at one and same position at the moment of fixing of the setting plate by the plate spring.

DETAILED DESCRIPTION OF THE INVENTION

Figure 1:
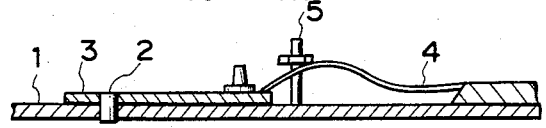
FIG. 1 is a longitudinal sectional view showing an example of a prior art arm mechanism.
Figure 2A:
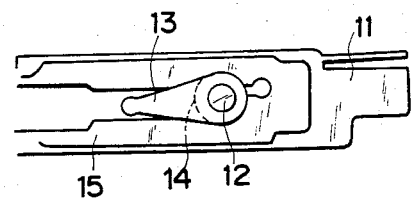
FIGS. 2(A) and (B) are a plan view and a longitudinal sectional view respectively, showing another prior art arm mechanism.
Figure 2B:
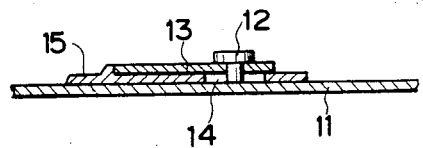
Figure 3:
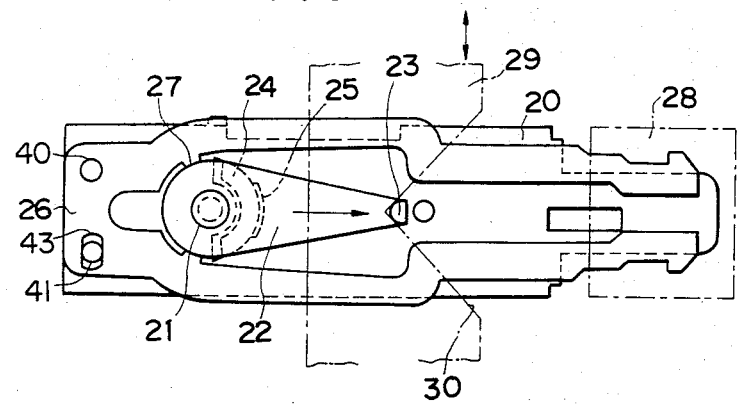
FIG. 3 is a plan view representing an example of an arm mechanism according to this invention.
Figure 4:
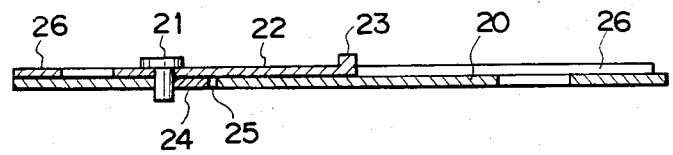
FIG. 4 is a longitudinal sectional view of the arm mechanism shown in FIG. 3.

Hereinbelow, this invention will be explained in more detail, referring to an embodiment shown in FIG. 3 and the following description.

In the drawing the reference numeral 20 is an arm and on this arm 20 a setting plate 22 is mounted rotatably. That is, a setting pin 21 is fixed to the arm 20, and the setting plate 22 is engaged with this setting pin 21 rotatably. The setting plate 22 consists of a member drop-shaped as a whole which is arc shaped at the end on the side of the extremity of the arm 20 and triangular at the other end on the side of the base of the arm 20. The end on the side of the base has a pressing projection 23 protruding upwards which is coupled with a V-shaped notch 30 of the memory slide 29.

Figure 5:
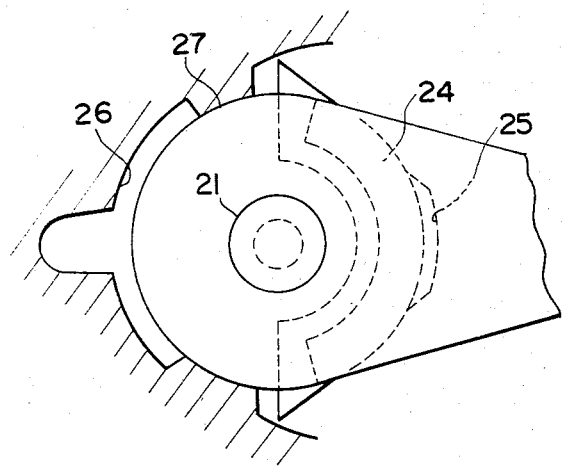
FIG. 5 is a plan view in an enlarged scale of the V-shaped guiding opening in the arm mechanism according to this invention.

On the other hand, on the lower surface of the setting plate 22, on the pushbutton side of the setting pin 21, a guide projection 24, whose peripheral surface is arc shaped, is formed in one united body. On the arm 20, corresponding to this guide projection 24, is formed an approximately V-shaped guide opening 25 behind the setting pin 21, and the above-mentioned guide projection 24 is inserted into this guide opening 25 movably. This guide opening 25 is symmetric with respect to the center line passing through the center of the setting pin 21, and its outer borders are inclined in a V-form pointing towards the end on the side of the base of the arm 20. Where this inclined part is in contact with the arc shaped outer surface of the guide projection 24, is formed an arc shaped opening, whose outer form is similar to that of the guide projection 24, as shown in an enlarged scale in FIG. 5.

On the upper surface of the arm 20 is disposed the approximately U-shaped plate spring 26 so that the setting plate 22 is surrounded by it. The plate spring 26 is fixed at its end portion to the extremity of the arm 20. The two branches, right and left, of the U-shape are extended towards the base side of the arm 20 so as to hold the setting plate 22 from right and left between them. On the other hand, inside of the branches of the plate spring 26 near their joint are formed arc shaped tightening members 27 and these tightening members 27 are in contact with the likewise arc shaped extremity of the setting plate 22 by surrounding it. Furthermore, a pushbutton 28 is mounted by engaging it with the base portion of the arm 20 and the right and left base portions of the plate spring 26 extending towards the base portion of the arm 20. That is, this pushbutton 28 is used to make the distance between the right and left base portions of the plate spring 26 smaller by pressing them from both the sides, when mounted on the arm 20. When the pushbutton 28 is half-way extracted with respect to the arm 20, the inward pressing force acting on the plate spring is released, which causes the enlargement of the distance between the right and left end portions of the plate spring 26.

The structure of the arm mechanism according to this embodiment has been elucidated as explained above. Hereinbelow its function will be explained.

In order to set the tuner to the frequency of a station to be selected by means of a pushbutton for a certain pushbutton and its arm, as is well known, a core is previously displaced to a predetermined position by rotating manually the tuning axis so that the frequency to be set is selected by the pushbutton. In this way, the memory slide 29 is displaced in the transverse direction together with the core and is located at a position corresponding to the frequency to be set. (Since the displacement mechanism for the memory slide is well known, it is not explained here.) In this state the pushbutton 28 mounted on the base portions of the arm 20 and the plate spring 26 is extracted half-way and the pressing force acting on the plate spring 26 is released. This gives rise to play between the tightening member 27 of the plate spring 26 and the fore part of the setting plate 22, and the setting plate 22 becomes freely rotatable around the setting pin 21.

After that, when the pushbutton 28 and the arm 20 is pushed into the tuner, the pressing projection 23 of the setting plate 22 comes in contact with the V-shaped notch 30 of the memory slide 29 and reach the vertex of the V-shaped notch 30, being guided by one of its slopes. In this case, since the position of the vertex of the V-shaped notch 30 is determined by the position of the memory slide 29 corresponding to the position of the core in the tuning coil, the setting plate 22 rotates around the setting pin 21 so that the pressing projection is at the position of the vertex of the V-shaped notch 30. In this way, when the pressing projection 23 and the V-shaped notch 30 of the memory slide 29 are coupled with each other by pushing the arm 20 into the tuner, the setting plate 22 is in the state of being drawn by the V-shaped notch 30 and tends to move relatively to the arm towards the base side of the arm 20. Then, the guide projection 24 disposed on the lower surface of the setting plate 22 comes in contact with the borders of the V-shaped guiding opening of the arm 20, and moves relatively to the arm towards the base side of the arm 20 along the borders. Consequently, even if there is play between the setting pin 21 and the setting plate 22, and the setting plate becomes movable, the setting plate 22 drawn by the memory slide 29 is always in contact with the deepest part of the guiding opening 25 of the arm 20. In this case, since the V-shaped guiding opening 25 is symmetric with respect to the center line and the guide projection 24 engaging with it has an arc shaped periphery, the center of the setting plate 22 is always on the center line of the guiding opening 25, i.e. on the center line of the arm 20.

After having set the angle of the setting plate 22 at the position of the V-shaped notch of the memory slide 29 and effecting the positioning of the setting plate 22 by engaging it with the guiding opening 25 by pressing force at the moment, as described above, the pushbutton 28 mounted on the base portion of the arm 20 is pushed further. Then, since the forward displacement of the arm 20 is prevented by the memory slide 28, only the pushbutton 28 slides along the arm 20 and is mounted perfectly on the arm 20. In this case, the right and left base portions of the plate spring 26 are pressed inward from both the sides, reducing the distance between the right and left branches of the U-shaped plate spring 26, and the fore part of the setting plate 22 is strongly tightened at its periphery. Consequently, the setting plate 22 is fixed to the arm 20 with an angle corresponding to the position of the V-shaped notch 30 of the memory slide 29.

After that, when the pushbutton is pushed into the tuner, since the pressing projection 23 of the setting plate 22 fixed to the arm 20 comes in contact with the V-shaped notch 30 and pushes it, the memory slide 29 moves correspondingly and the insertion position of the core in the coil, whose displacement is coupled with this memory slide, is thus determined.

As shown above in the embodiment, the arm mechanism according to this invention is characterized in the fact that a V-shaped guiding opening 25 is formed in the arm 20, and that an arc shaped guide projection 24 is coupled with the periphery of the setting plate. At the moment when the setting plate 22 is mounted with a predetermined angle on the arm 20, since the guide projection 24 is so arranged that it is pushed towards the narrower part of the V-shaped guiding opening 25, the contact position of the guide projection 24 with the guiding opening remains always constant and thus the center of the setting plate 22 comes always to a well determined position. Consequently, when the setting plate 22 is fixed by the plate spring 26, there are no errors in centering of the setting plate 22, and it is possible to fix surely the setting plate 22 at a position in accordance with that of the V-shaped notch 30 of the memory slide. Consequently, when the pushbutton is pushed, it is possible to remove the memory slide 29 to the position corresponding exactly to the selected frequency, and the inconvenience of errors in frequency produced by tuning when using the pushbutton are substantially eliminated.

In particular, according to this invention, since an arc shaped recess has a periphery which is similar to that of the guide projection at the contact part between the V-shaped guiding opening and the guide projection, the contact surface between the guiding opening and the guide projection is large and the friction between them is great. Thus, when the setting plate is pushed by the plate spring, the guide projection is coupled strongly with the guiding opening. Consequently, its hold is ameliorated and it is not feared that the setting plate is displaced inadvertently on the arm. Furthermore, since the contact surface between the guide projection and the V-shaped guiding opening is large, positioning of the guide projection is strongly and surely effected in the guiding opening.

I claim:

1. Arm mechanism of a pushbutton tuner comprising:
an arm;
a setting pin disposed on said arm;
a setting plate mounted rotatably on said setting pin;

a plate spring disposed around the periphery of the setting plate on said arm;

a pushbutton mounted at an end of said arm, said plate spring fixing the setting plate to the arm by mounting the pushbutton on the arm;

a guide projection disposed on the lower surface of said setting plate;

a guiding opening disposed on the arm cooperating with said guide projection; and pressing means for pressing said guide projection towards the guiding opening when the pushbutton is pushed and moves relative to said plate spring.

2. Arm mechanism according to claim 1, wherein said guide projection is arc shaped on the side of the pushbutton, and said guiding opening is arc shaped at the part which is in contact with the guide projection and being V-shaped as a whole symmetrically with respect to the center line.

3. Arm mechanism according to the claim 1, wherein said pressing means comprises a pressing projection disposed on the end portion of the setting plate on the side of the pushbutton, and said pressing projection is engaged with a V-shaped notch of the memory slide of the pushbutton tuner.

* * * * *